(12) United States Patent
Liu et al.

(10) Patent No.: US 12,726,197 B2
(45) Date of Patent: Sep. 1, 2026

(54) VOLTAGE LEVEL SHIFTER

(71) Applicant: Winbond Electronics Corp., Taichung City (TW)

(72) Inventors: Hsing-Yu Liu, Hsinchu (TW); Yu-Che Liu, Hsinchu (TW)

(73) Assignee: Winbond Electronics Corp., Taichung City (TW)

( * ) Notice: Subject to any disclaimer, the term of this patent is extended or adjusted under 35 U.S.C. 154(b) by 15 days.

(21) Appl. No.: 19/078,289

(22) Filed: Mar. 13, 2025

(65) Prior Publication Data

US 2025/0300658 A1 Sep. 25, 2025

(30) Foreign Application Priority Data

Mar. 19, 2024 (TW) ................................ 113110070

(51) Int. Cl.
*H03K 19/0185* (2006.01)
*H03K 19/0175* (2006.01)

(52) U.S. Cl.
CPC . *H03K 19/018507* (2013.01); *H03K 19/0175* (2013.01)

(58) Field of Classification Search
CPC ....... H03K 19/018507; H03K 19/0175; H03K 19/0008; H03K 19/0013; H03K 19/01; H03K 19/017; H03K 19/0185; H03K 19/018514; H03K 19/018521; H03K 19/018528; H03K 19/017509; H03K 19/017518; H03K 19/017527; H03K 19/01707; H03K 19/01714; H03K 19/01721; H03K 3/356; H03K 3/356104; H03K 3/3562; H03K 3/35625; H03K 3/38; H03K 5/003; G06F 3/00; G06F 3/1295
See application file for complete search history.

(56) References Cited

U.S. PATENT DOCUMENTS

2002/0180508 A1* 12/2002 Kanno .............. H03K 19/0016 327/333

FOREIGN PATENT DOCUMENTS

| | | |
|---|---|---|
| CN | 108736878 | 1/2022 |
| KR | 100719678 | 5/2007 |
| TW | 1656737 | 4/2019 |

* cited by examiner

*Primary Examiner* — Jung Kim
(74) *Attorney, Agent, or Firm* — JCIPRNET

(57) ABSTRACT

A voltage level shifter includes a voltage level shift circuit and a boost circuit. The voltage level shift circuit includes a first boost input terminal, a second boost input terminal and a shift output terminal, and operates between a first voltage and a second voltage. The first boost input terminal is configured to receive a first boost voltage, the second boost input terminal is configured to receive a second boost voltage, and the shift output terminal is configured to output a shift voltage. The boost circuit operates between a third voltage and the second voltage, and is configured to receive an input signal and provide the first boost voltage and the second boost voltage to the voltage level shift circuit. The boost circuit boosts one of the first boost voltage and the second boost voltage according to the third voltage in response to the input signal.

18 Claims, 4 Drawing Sheets

VOLTAGE LEVEL SHIFTER

CROSS-REFERENCE TO RELATED APPLICATION

This application claims the priority benefit of Taiwan application serial no. 113110070, filed on Mar. 19, 2024. The entirety of the above-mentioned patent application is hereby incorporated by reference herein and made a part of this specification.

BACKGROUND

Technical Field

The present disclosure relates to a voltage conversion circuit, and in particular, to a voltage level shifter adaptable for operating at a low supply voltage.

Description of Related Art

For integrated electronic products with multiple functions, a voltage level shifter is usually required to switch between different operating voltage ranges. For example, memory devices normally include voltage level shifters to perform shifting operations between different voltage levels.

However, to adapt to the requirement for energy saving, the power supply voltage of electronic products has now decreased. In the case where the power supply voltage is low (for example, below 0.9 volts), when the input signal switches from a low voltage level to a high voltage level, existing voltage level shifters may not be able to complete the signal transition within a specified time (such as 100 nanoseconds), and might even fail to function. As a result, not only the transition speed is too slow, but the transition current will also be too large, which will be very likely to cause high power consumption of the voltage level shifter, and it will be difficult to meet the requirement for energy saving.

SUMMARY

The present disclosure provides a voltage level shifter to avoid the problems of slow transition speed, excessively large transition current, and functional failure when the power supply voltage is low.

A voltage level shifter of the present disclosure includes a voltage level shift circuit and a boost circuit. The voltage level shift circuit includes a first boost input terminal, a second boost input terminal and a shift output terminal, and operates between a first voltage and a second voltage. The first boost input terminal is configured to receive a first boost voltage, the second boost input terminal is configured to receive a second boost voltage, and the shift output terminal is configured to output a shift voltage. The boost circuit is coupled to the voltage level shift circuit. The boost circuit operates between a third voltage and the second voltage, and is configured to receive an input signal through an input terminal, and provide the first boost voltage and the second boost voltage to the voltage level shift circuit through an output terminal. The boost circuit boosts one of the first boost voltage and the second boost voltage according to the third voltage in response to the input signal.

Based on the above, the voltage level shifter of the present disclosure is able to drive the voltage level shift circuit with a voltage value greater than the input signal through the boost circuit. In this way, not only that it is possible to increase the transition speed, but also reduce the generation of transition current, thereby reducing power consumption and facilitating the application of energy-saving products.

In order to make the above-mentioned features and advantages of the present disclosure clearer and easier to understand, embodiments are given below and described in detail with reference to the attached drawings.

DESCRIPTION OF THE EMBODIMENTS

Figure 1:
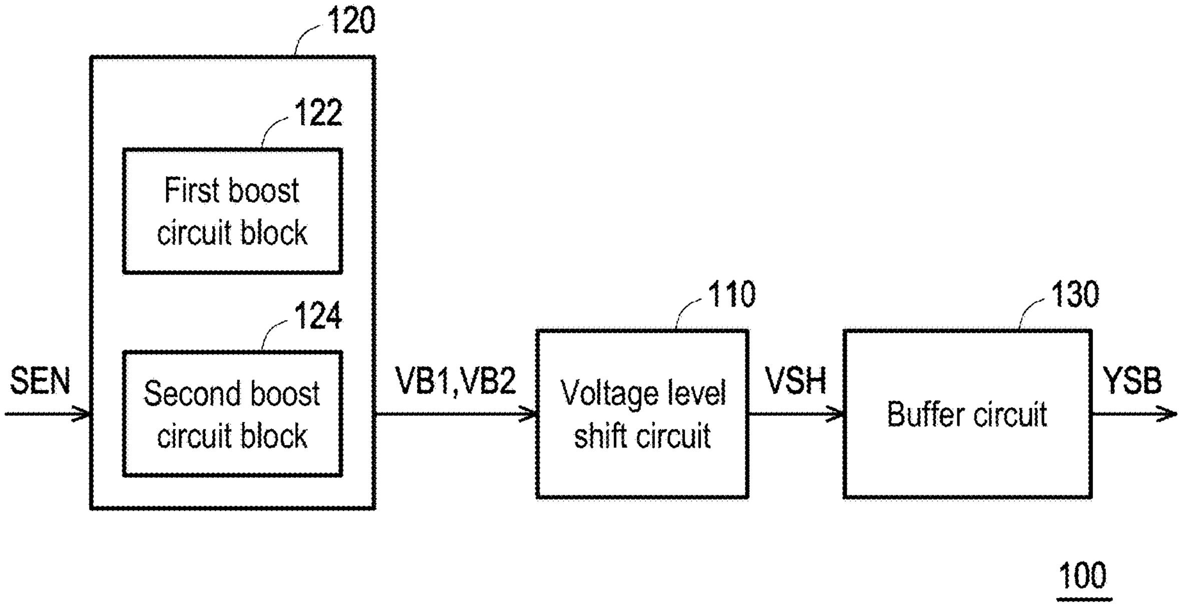
FIG. 1 is a block schematic view of a voltage level shifter according to an embodiment of the present disclosure.
Figure 2:
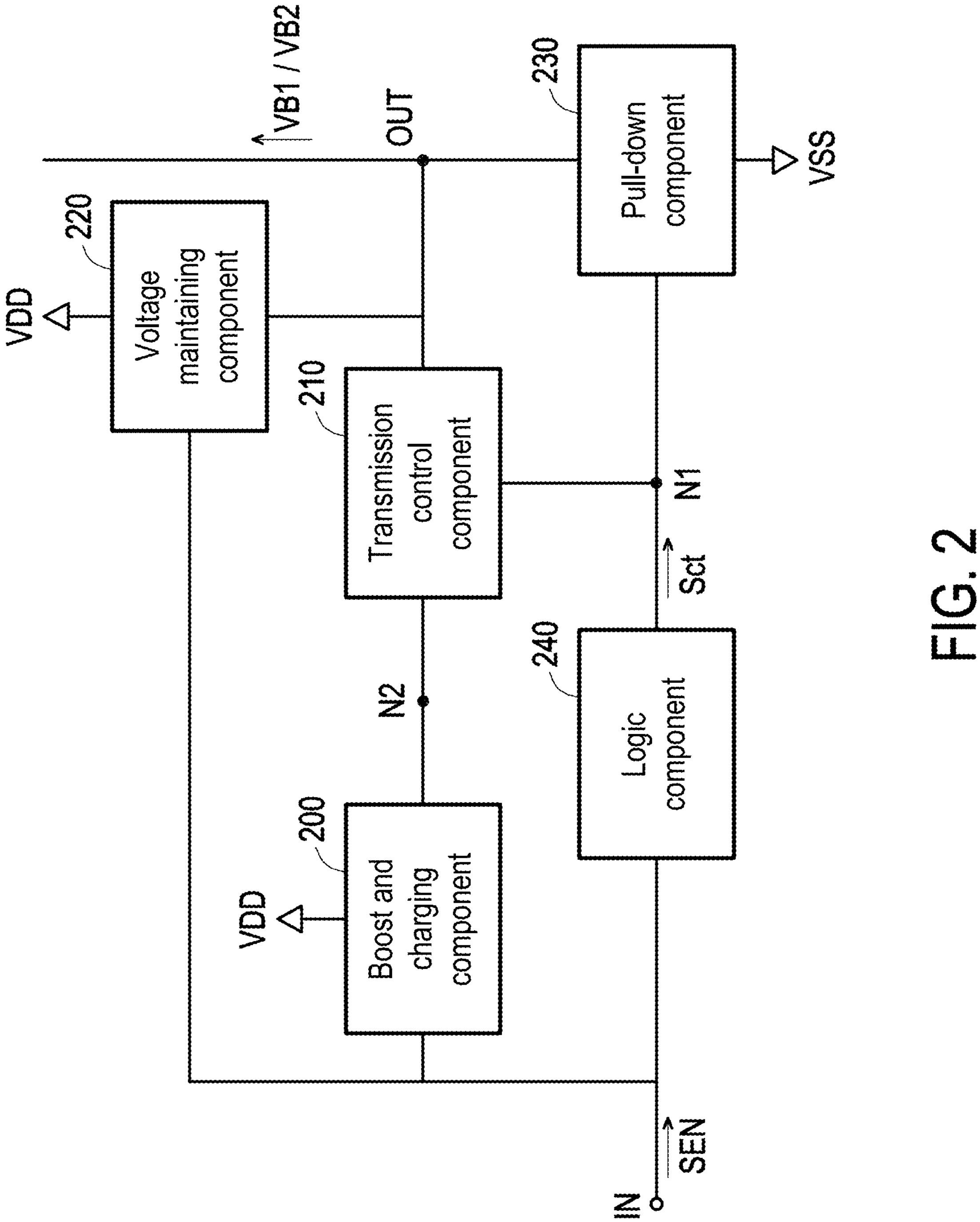
FIG. 2 is a schematic block view of a boost circuit block according to an embodiment of the present disclosure.
Figure 3:
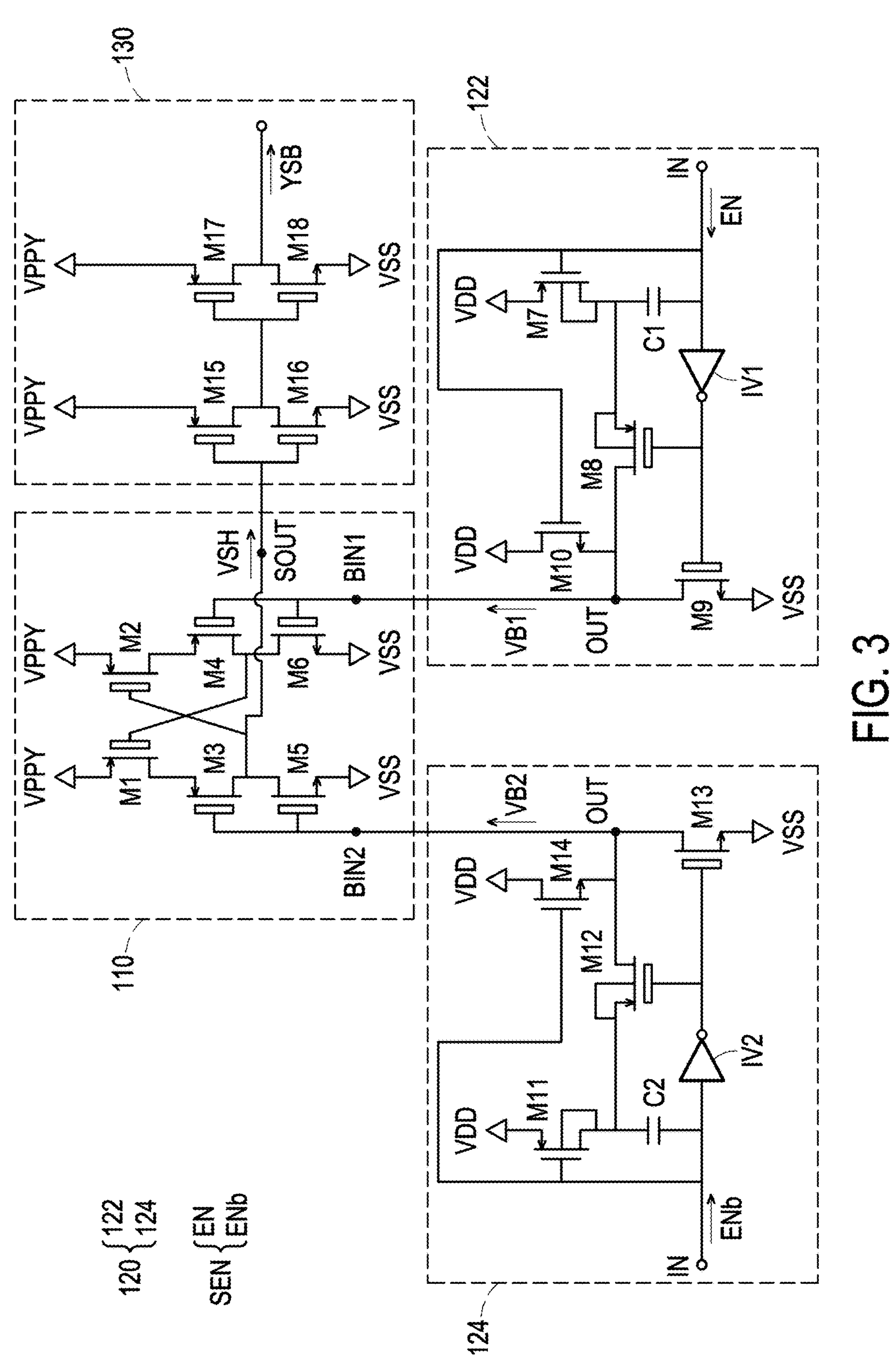
FIG. 3 is a schematic circuit structural view of the voltage level shifter of the embodiment of FIG. 1.

Please refer to FIG. 1 to FIG. 3. The voltage level shifter 100 of this embodiment includes a voltage level shift circuit 110, a boost circuit 120 and a buffer circuit 130. The voltage level shift circuit 110 is coupled to the boost circuit 120 and the buffer circuit 130. In this embodiment, the voltage level shift circuit 110 is, for example, a circuit configuration with a single-ended output and a differential input, including a first boost input terminal BIN1, a second boost input terminal BIN2, and a shift output terminal SOUT. The first boost input terminal BIN1 is configured to receive a first boost voltage VB1, the second boost input terminal BIN2 is configured to receive a second boost voltage VB2, and the shift output terminal SOUT is configured to output a shift voltage VSH.

The voltage level shift circuit 110 operates between a first voltage VPPY and a second voltage VSS. The first voltage VPPY is higher than the second voltage VSS. The first voltage VPPY is, for example, 9 volts to 10 volts, and the second voltage VSS is, for example, 0 volts (i.e., ground voltage), but the disclosure is not limited thereto.

As shown in FIG. 3, the voltage level shift circuit 110 includes a first transistor M1, a second transistor M2, a third transistor M3, a fourth transistor M4, a fifth transistor M5 and a sixth transistor M6. Each of the first transistor M1, the second transistor M2, the third transistor M3, the fourth transistor M4, the fifth transistor M5 and the sixth transistor M6 includes a first terminal, a second terminal and a control terminal. The first terminal of the first transistor M1 is coupled to the first voltage VPPY. The first terminal of the second transistor M2 is coupled to the first voltage VPPY. The first terminal of the third transistor M3 is coupled to the second terminal of the first transistor M1. The second terminal of the third transistor M3 is coupled to the control terminal of the second transistor M2 and the shift output terminal SOUT. The control terminal of the third transistor M3 is coupled to the second boost input terminal BIN2. The first terminal of the fourth transistor M4 is coupled to the second terminal of the second transistor M2. The second terminal of the fourth transistor M4 is coupled to the control terminal of the first transistor M1. The control terminal of the fourth transistor M4 is coupled to the first boost input terminal BIN1. The first terminal of the fifth transistor M5 is coupled to the control terminal of the second transistor M2, the second terminal of the third transistor M3 and the shift output terminal SOUT. The second terminal of the fifth transistor M5 is coupled to the second voltage VSS. The control terminal of the fifth transistor M5 is coupled to the second boost input terminal BIN2. The first terminal of the sixth transistor M6 is coupled to the control terminal of the first transistor M1 and the second terminal of the fourth transistor M4. The second terminal of the sixth transistor M6 is coupled to the second voltage VSS. The control terminal of the sixth transistor M6 is coupled to the first boost input terminal BIN1. In this embodiment, the first to sixth transistors M1 to M6 are high-voltage metal oxide semiconductor field effect transistors.

Based on the above structure, the voltage level shift circuit 110 may shift the voltage levels of the differentially input first boost voltage VB1 and the second boost voltage VB2 to the first voltage VPPY as the shift voltage VSH for output. The first boost voltage VB1 is in phase with the shift voltage VSH, and the second boost voltage VB2 is in opposite phase with the shift voltage VSH.

The buffer circuit 130 also operates between the first voltage VPPY and the second voltage VSS. The buffer circuit 130 is configured to receive the shift voltage VSH to provide the output signal YSB.

The boost circuit 120 operates between the third voltage VDD and the second voltage VSS. The third voltage VDD is lower than the first voltage VPPY and higher than the second voltage VSS. In practical applications, the third voltage VDD is, for example, 0.78 volts to 1.2 volts. In this embodiment, the third voltage VDD is the supply voltage.

The boost circuit 120 is configured to receive the input signal SEN and provide the first boost voltage VB1 and the second boost voltage VB2 to the voltage level shift circuit 110. In this embodiment, the boost circuit 120 may boost one of the first boost voltage VB1 and the second boost voltage VB2 according to the third voltage VDD in response to the input signal SEN.

As shown in FIG. 1, the boost circuit 120 according to an embodiment of the present disclosure may include a first boost circuit block 122 and a second boost circuit block 124. As shown in FIG. 2, each boost circuit block according to an embodiment of the present disclosure includes a boost and charging component 200, a transmission control component 210, a voltage maintaining component 220, a pull-down component 230 and a logic component 240. The boost circuit 120 is configured to receive the input signal SEN through the input terminal IN and provide the input signal SEN to the boost and charging component 200, the voltage maintaining component 220 and the logic component 240. The logic component 240 is configured to generate the control signal Sct to the node N1 according to the input signal SEN. The boost and charging component 200 is configured to charge the node N2 according to the input signal SEN, and to boost the node N2 between the boost and charging component 200 and the transmission control component 210 according to the third voltage VDD. In an embodiment, the boost and charging component 200 is configured to charge the node N2 first according to the input signal SEN, and then boost the charged node N2 to increase the voltage of the node N2 to twice the third voltage VDD. The transmission control component 210 and the pull-down component 230 are coupled to the logic component 240 through the node N1 to receive the control signal Sct. In addition, the transmission control component 210 is also coupled to the boost and charging component 200 through the node N2, and determines whether to provide the voltage from the node N2 to the output terminal OUT according to the control signal Sct. The pull-down component 230 determines whether to pull the output terminal OUT down to the second voltage VSS according to the control signal Sct. The voltage maintaining component 220 is configured to determine whether to provide the third voltage VDD to the output terminal OUT according to the input signal SEN, thereby preventing the output terminal OUT from floating before the pull-down component 230 is enabled. The output terminal OUT is configured to provide the first boost voltage VB1 or the second boost voltage VB2.

Specifically, the input signal SEN in this embodiment includes a first input signal EN and a second input signal ENb. In FIG. 3, the first boost circuit block 122 and the second boost circuit block 124 are respectively coupled to the first boost input terminal BIN1 and the second boost input terminal BIN2 of the voltage level shift circuit 110 through the output terminal OUT. The first boost circuit block 122 may receive the first input signal EN through the input terminal IN, and provide the first boost voltage VB1 to the voltage level shift circuit 110 through the output terminal OUT according to the first input signal EN. The second boost circuit block 124 may receive the second input signal ENb through the input terminal IN, and provide the second boost voltage VB2 to the voltage level shift circuit 110 through the output terminal OUT according to the second input signal ENb.

Figure 4:
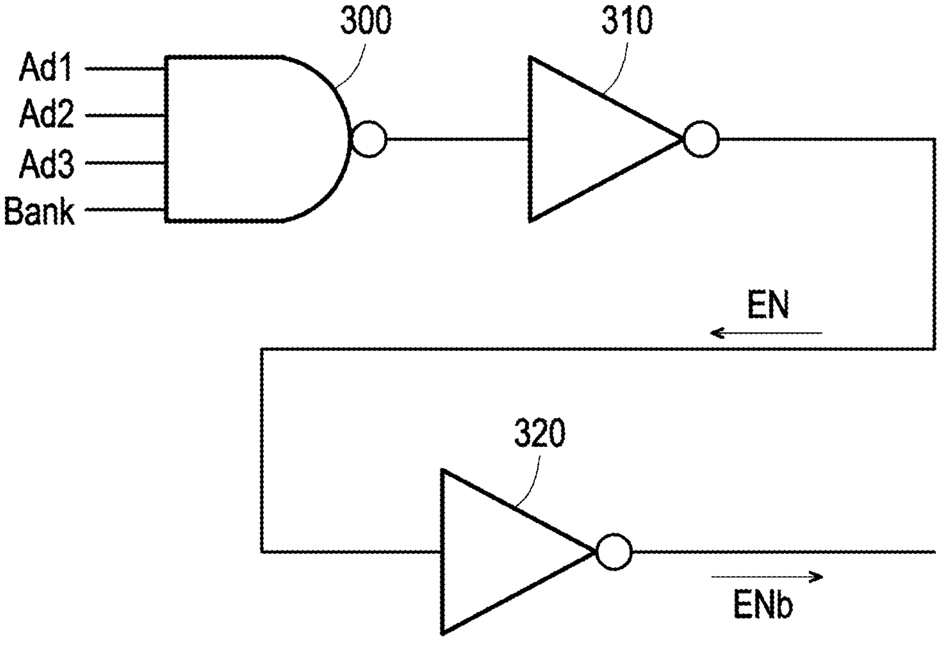
FIG. 4 is an example of a generating method for an input signal according to an embodiment of the present disclosure.

The first input signal EN is inverse phase with the second input signal ENb. For example, the voltage level shifter 100 may be applied to a read operation of a memory device. For example, in an embodiment, the voltage level shifter 100 may be used to control switches between global bit lines and data lines, but the disclosure is not limited thereto. As shown in FIG. 4, a NAND gate 300 receives address signals Ad1 to Ad3 and an enable signal Bank. The address signals Ad1 to Ad3 may, for example, constitute the memory address to be read. When the address signals Ad1 to Ad3 and the enable signal Bank are enabled (become a high voltage level), the first input signal EN at the high voltage level is generated through an inverter 310, and the second input signal ENb at the low voltage level is generated through an inverter 320. The memory device is, for example, a non-volatile memory, such as a flash memory, or a volatile memory, such as a DRAM, but the disclosure is not limited thereto. In this embodiment, the memory device is a NOR flash memory.

In an embodiment, as shown in FIG. 3, the boost and charging component 200 of the first boost circuit block 122 may include a seventh transistor M7 and a first capacitor C1. The transmission control component 210 may include an eighth transistor M8. The logic component 240 may include a first inverter IV1. The pull-down component 230 may include a ninth transistor M9. The voltage maintaining component 220 may include a tenth transistor M10. Each of the seventh transistor M7, the eighth transistor M8, the ninth transistor M9 and the tenth transistor M10 includes a first terminal, a second terminal and a control terminal. A first capacitor C1 includes a first terminal and a second terminal. The first inverter IV1 includes an input terminal and an output terminal. The first terminal of the seventh transistor M7 is coupled to the third voltage VDD. The control terminal of the seventh transistor M7 receives the first input signal EN. The first terminal of the first capacitor C1 is coupled to the second terminal of the seventh transistor M7. The second terminal of the first capacitor C1 receives the first input signal EN. The first terminal of the eighth transistor M8 is coupled to the second terminal of the seventh transistor M7 and the first terminal of the first capacitor C1. The second terminal of the eighth transistor M8 is coupled to the first boost input terminal BIN1 of the voltage level shift circuit 110, and may output the first boost voltage VB1 to the voltage level shift circuit 110. The input terminal of the first inverter IV1 receives the first input signal EN. The output terminal of the first inverter IV1 is coupled to the control terminal of the eighth transistor M8. The first terminal of the ninth transistor M9 is coupled to the second terminal of the eighth transistor M8. The second terminal of the ninth transistor M9 is coupled to the second voltage VSS. The control terminal of the ninth transistor M9 is coupled to the output terminal of the first inverter IV1. The first terminal of the tenth transistor M10 is coupled to the third voltage VDD. The second terminal of the tenth transistor M10 is coupled to the second terminal of the eighth transistor M8. The control terminal of the tenth transistor M10 receives the first input signal EN. In this embodiment, the seventh transistor M7 is a P-type field effect transistor, and the tenth transistor M10 is an N-type field effect transistor. The backgate of the seventh transistor M7 is coupled to the second terminal of the seventh transistor M7, and the backgate of the eighth transistor M8 is coupled to the first terminal of the eighth transistor M8. The eighth transistor M8 and the ninth transistor M9 are high-voltage metal oxide semiconductor field effect transistors.

The circuit structure of the second boost circuit block 124 is symmetrical to the circuit structure of the first boost circuit block 122. The boost and charging component 200 of the second boost circuit block 124 may include an eleventh transistor M11 and a second capacitor C2. The transmission control component 210 may include a twelfth transistor M12. The logic component 240 may include a second inverter IV2. The pull-down component 230 may include a thirteenth transistor M13. The voltage maintaining component 220 may include a fourteenth transistor M14. Each of the eleventh transistor M11, the twelfth transistor M12, the thirteenth transistor M13 and the fourteenth transistor M14 includes a first terminal, a second terminal and a control terminal. The second capacitor C2 includes a first terminal and a second terminal. The second inverter IV2 includes an input terminal and an output terminal. The first terminal of the eleventh transistor M11 is coupled to the third voltage VDD. The control terminal of the eleventh transistor M11 receives the second input signal ENb. The first terminal of the second capacitor C2 is coupled to the second terminal of the eleventh transistor M11. The second terminal of the second capacitor C2 receives the second input signal ENb. The first terminal of the twelfth transistor M12 is coupled to the second terminal of the eleventh transistor M11 and the first terminal of the second capacitor C2. The second terminal of the twelfth transistor M12 is coupled to the second boost input terminal BIN2 of the voltage level shift circuit 110 and may output the second boost voltage VB2 to the voltage level shift circuit 110. The input terminal of the second inverter IV2 receives the second input signal ENb. The output terminal of the second inverter IV2 is coupled to the control terminal of the twelfth transistor M12. The first terminal of the thirteenth transistor M13 is coupled to the second terminal of the twelfth transistor M12. The second terminal of the thirteenth transistor M13 is coupled to the second voltage VSS. The control terminal of the thirteenth transistor M13 is coupled to the output terminal of the second inverter IV2. The first terminal of the fourteenth transistor M14 is coupled to the third voltage VDD. The second terminal of the fourteenth transistor M14 is coupled to the second terminal of the twelfth transistor M12, and the control terminal of the fourteenth transistor M14 receives the second input signal ENb. In this embodiment, the eleventh transistor M11 is a P-type field effect transistor, and the fourteenth transistor M14 is an N-type field effect transistor. The backgate of the eleventh transistor M11 is coupled to the second terminal of the eleventh transistor M11, and the backgate of the twelfth transistor M12 is coupled to the first terminal of the twelfth transistor M12. The twelfth transistor M12 and the thirteenth transistor M13 are high-voltage metal oxide semiconductor field effect transistors.

In operation, during the transition period of the input signal SEN (that is, during the period when the first input signal EN or the second input signal ENb is converted from a low voltage level to a high voltage level), the boost circuit 120 may boost the voltage value of one of the first boost voltage VB1 and the second boost voltage VB2 to a voltage value greater than the third voltage VDD according to the third voltage VDD. Specifically, taking the first boost circuit block 122 as an example, when the first input signal EN is at a low voltage level (i.e., equal to the second voltage VSS), the seventh transistor M7 is controlled to turn on by the first input signal EN, and the first capacitor C1 is charged to the third voltage VDD. The eighth transistor M8 is controlled to turn off by the high voltage level provided by the output terminal of the first inverter IV1, and the ninth transistor M9 is controlled to turn on by the high voltage level provided by the output terminal of the first inverter IV1. In this way, it is possible to isolate the first boost input terminal BIN1 of the voltage level shift circuit 110 from the first capacitor C1, and the first boost voltage VB1 on the first boost input terminal BIN1 is pulled down to the second voltage VSS. In the meantime, the tenth transistor M10 is controlled to turn off by the first input signal EN.

When the first input signal EN is converted from a low voltage level to a high voltage level (that is, converted from the second voltage VSS to the third voltage VDD), the seventh transistor M7 is controlled to turn off by the first input signal EN. The eighth transistor M8 is controlled to turn on by the low voltage level provided by the output terminal of the first inverter IV1, and the ninth transistor M9 is controlled to turn off by the low voltage level provided by the output terminal of the first inverter IV1. In this way, it is possible to pull up the first boost voltage VB1 to be greater than the third voltage VDD (for example, pulled up to approximately twice the third voltage VDD) through the voltage of the first capacitor C1 (approximately equal to the third voltage VDD) plus the high voltage level of the first input signal EN itself.

In this way, even if the voltage value of the high voltage level of the first input signal EN is low, the voltage level shift circuit 110 may be driven with the first boost voltage VB1 whose voltage value is nearly twice that of the first input signal EN. Not only that the transition speed of the voltage level shifter 100 may be increased, but also the generation of transition current may be reduced, thereby reducing power consumption. Moreover, the reduced power consumption may further reduce the load of the charge pump circuit used to generate the first voltage VPPY. Incidentally, the transition current in this embodiment is the sum of the current transmitted from the first terminal of the first transistor M1 in the voltage level shift circuit 110 to the second terminal of the fifth transistor M5 through the first transistor M1, the third transistor M3, and the fifth transistor M5 and the current transmitted from the first terminal of the second transistor M2 to the second terminal of the sixth transistor M6 through the second transistor M2, the fourth transistor M4, and the sixth transistor M6 during the transition period of the input signal SEN.

Moreover, during the period when the first input signal EN is at a high voltage level, when the first boost voltage VB1 is greater than the third voltage VDD, because the voltage value of the second terminal of the tenth transistor M10 is greater than the voltage value of the control terminal, the tenth transistor M10 remains turned off until the first boost voltage VB1 gradually decreases to be equal to the third voltage VDD due to leakage current and other factors. When the first boost voltage VB1 drops to be equal to the third voltage VDD, the tenth transistor M10 will be turned on, so that the first boost voltage VB1 is maintained at the third voltage VDD without falling again, thereby preventing the first boost input terminal BIN1 of the voltage level shift circuit 110 from becoming a floating state.

In this embodiment, description of the operation of the second boost circuit block 124 may be derived from the operation of the first boost circuit block 122. Since the first input signal EN is inverse phase with the second input signal ENb, the first boost voltage VB1 is also inverse phase with the second boost voltage VB2. The operation of the second boost circuit block 124 will not be described again here.

In FIG. 3, the buffer circuit 130 includes a fifteenth transistor M15, a sixteenth transistor M16, a seventeenth transistor M17, and an eighteenth transistor M18. Each of the fifteenth transistor M15, the sixteenth transistor M16, the seventeenth transistor M17 and the eighteenth transistor M18 includes a first terminal, a second terminal and a control terminal. The first terminal of the fifteenth transistor M15 is coupled to the first voltage VPPY. The control terminal of the fifteenth transistor M15 is coupled to the shift output terminal SOUT. The first terminal of the sixteenth transistor M16 is coupled to the second terminal of the fifteenth transistor M15. The second terminal of the sixteenth transistor M16 is coupled to the second voltage VSS, and the control terminal of the sixteenth transistor M16 is coupled to the shift output terminal SOUT. The first terminal of the seventeenth transistor M17 is coupled to the first voltage VPPY. The control terminal of the seventeenth transistor M17 is coupled to the second terminal of the fifteenth transistor M15 and the first terminal of the sixteenth transistor M16. The first terminal of the eighteenth transistor M18 is coupled to the second terminal of the seventeenth transistor M17 and may output the output signal YSB. The second terminal of the eighteenth transistor M18 is coupled to the second voltage VSS. The control terminal of the eighteenth transistor M18 is coupled to the second terminal of the fifteenth transistor M15 and the first terminal of the sixteenth transistor M16. In this embodiment, the fifteenth to eighteenth transistors M15 to M18 are high-voltage metal oxide semiconductor field effect transistors. Based on the above structure, the first input signal EN and the output signal YSB are in phase.

In summary, the voltage level shifter of the present disclosure may operate normally when receiving an input signal with a lower voltage value and avoid errors. For example, when being applied in energy-saving electronic products, a low power supply voltage is normally adopted during the power-on read operation. The voltage level shifter of the present disclosure may avoid errors in the power-on read operation and enable the internal information of the power-on readback chip to operate normally. In addition, the voltage level shifter according to the present disclosure may not only increase the transition speed, but also reduce the generation of transition current, thereby reducing power consumption. Therefore, the present disclosure is preferable for application to energy-saving products and belongs to a green semiconductor technology.

What is claimed is:

1. A voltage level shifter, comprising:

a voltage level shift circuit comprising a first boost input terminal, a second boost input terminal and a shift output terminal, and operating between a first voltage and a second voltage, wherein the first boost input terminal is configured to receive a first boost voltage, the second boost input terminal is configured to receive a second boost voltage, and the shift output terminal is configured to output a shift voltage; and a boost circuit coupled to the voltage level shift circuit, operating between a third voltage and the second voltage, and configured to receive an input signal through an input terminal, and providing the first boost voltage and the second boost voltage to the voltage level shift circuit through an output terminal, wherein the boost circuit boosts one of the first boost voltage and the second boost voltage according to the third voltage in response to the input signal, wherein the boost circuit comprises a plurality of boost circuit blocks, each of the boost circuit blocks comprises:

a logic component configured to generate a control signal to a first node based on the input signal;

a boost and charging component coupled between the input terminal and a second node, configured to charge the second node according to the input signal, and to boost the second node according to the third voltage; and a transmission control component configured to be coupled to the logic component through the first node, coupled to the boost and charging component through the second node, and to determine whether to supply a voltage from the second node to the output terminal according to the control signal.

2. The voltage level shifter according to claim 1, wherein the third voltage is a supply voltage, and the supply voltage is less than or equal to 1.2 volts.

3. The voltage level shifter according to claim 1, wherein each of the plurality of boost circuit blocks further comprises:

a voltage maintaining component coupled between the input terminal and the output terminal and configured to determine whether to provide the third voltage to the output terminal according to the input signal; and a pull-down component coupled between the first node and the output terminal, and configured to determine whether to pull the output terminal down to the second voltage according to the control signal.

4. The voltage level shifter according to claim 1, wherein during a transition period of the input signal, the boost circuit boosts a voltage value of one of the first boost voltage and the second boost voltage to a voltage value greater than the third voltage according to the third voltage.

5. The voltage level shifter according to claim 1, wherein the voltage level shift circuit comprises:

a first transistor comprising a first terminal, a second terminal and a control terminal, wherein the first terminal of the first transistor is coupled to the first voltage;

a second transistor comprising a first terminal, a second terminal and a control terminal, wherein the first terminal of the second transistor is coupled to the first voltage;

a third transistor comprising a first terminal, a second terminal and a control terminal, wherein the first terminal of the third transistor is coupled to the second terminal of the first transistor, the second terminal of the third transistor is coupled to the control terminal of the second transistor and the shift output terminal, and the control terminal of the third transistor is coupled to the second boost input terminal;

a fourth transistor comprising a first terminal, a second terminal and a control terminal, wherein the first terminal of the fourth transistor is coupled to the second terminal of the second transistor, the second terminal of the fourth transistor is coupled to the control terminal of the first transistor, and the control terminal of the fourth transistor is coupled to the first boost input terminal;

a fifth transistor comprising a first terminal, a second terminal and a control terminal, wherein the first terminal of the fifth transistor is coupled to the control terminal of the second transistor, the second terminal of the third transistor, and the shift output terminal, the second terminal of the fifth transistor is coupled to the second voltage, the control terminal of the fifth transistor is coupled to the second boost input terminal; and a sixth transistor comprising a first terminal, a second terminal and a control terminal, wherein the first terminal of the sixth transistor is coupled to the control terminal of the first transistor and the second terminal of the fourth transistor, the second terminal of the sixth transistor is coupled to the second voltage, and the control terminal of the sixth transistor is coupled to the first boost input terminal.

6. The voltage level shifter according to claim 5, wherein the first transistor, the second transistor, the third transistor, the fourth transistor, the fifth transistor and the sixth transistor are high-voltage metal oxide semiconductor field effect transistors.

7. The voltage level shifter according to claim 1, wherein the input signal comprises a first input signal and a second input signal, the first input signal is inverse phase with the second input signal, and the plurality of boost circuit blocks comprise:

a first boost circuit block coupled to the first boost input terminal, configured to receive the first input signal, and provide the first boost voltage according to the first input signal; and a second boost circuit block coupled to the second boost input terminal, configured to receive the second input signal, and provide the second boost voltage according to the second input signal.

8. The voltage level shifter according to claim 3, wherein the plurality of boost circuit blocks comprise a first boost circuit block, and the boost and charging component of the first boost circuit block comprises:

a seventh transistor comprising a first terminal, a second terminal and a control terminal, wherein the first terminal of the seventh transistor is coupled to the third voltage, and the control terminal of the seventh transistor receives a first input signal of the input signal; and a first capacitor comprising a first terminal and a second terminal, wherein the first terminal of the first capacitor is coupled to the second terminal of the seventh transistor, the second terminal of the first capacitor receives the first input signal.

9. The voltage level shifter according to claim 8, wherein in the first boost circuit block, the transmission control component comprises an eighth transistor comprising a first terminal, a second terminal and a control terminal, wherein the first terminal of the eighth transistor is coupled to the second terminal of the seventh transistor and the first terminal of the first capacitor, the second terminal of the eighth transistor is coupled to the first boost input terminal and output the first boost voltage;

the logic component comprises a first inverter comprising an input terminal and an output terminal, wherein the input terminal of the first inverter receives the first input signal, and the output terminal of the first inverter is coupled to the control terminal of the eighth transistor;

the pull-down component comprises a ninth transistor comprising a first terminal, a second terminal and a control terminal, wherein the first terminal of the ninth transistor is coupled to the second terminal of the eighth transistor, the second terminal of the ninth transistor is coupled to the second voltage, and the control terminal of the ninth transistor is coupled to the output terminal of the first inverter; and the voltage maintaining component comprises a tenth transistor comprising a first terminal, a second terminal and a control terminal, wherein the first terminal of the tenth transistor is coupled to the third voltage, the second terminal of the tenth transistor is coupled to the second terminal of the eighth transistor, and the control terminal of the tenth transistor receives the first input signal.

10. The voltage level shifter according to claim 9, wherein the seventh transistor is a P-type field effect transistor, the tenth transistor is an N-type field effect transistor, the eighth transistor and the ninth transistor are high-voltage metal oxide semiconductor field effect transistors, a backgate of the seventh transistor is coupled to the second terminal of the seventh transistor, and a backgate of the eighth transistor is coupled to the first terminal of the eighth transistor.

11. The voltage level shifter according to claim 9, wherein when the first input signal is at a low voltage level, the seventh transistor is turned on to charge the first capacitor to the third voltage, the eighth transistor is turned off, and the ninth transistor is turned on to pull the first boost voltage down to the second voltage.

12. The voltage level shifter according to claim 9, wherein when the first input signal is converted from a low voltage level to a high voltage level, the seventh transistor is turned off, the eighth transistor is turned on, and the ninth transistor is turned off to pull up the first boost voltage to be greater than the third voltage through a voltage of the first capacitor.

13. The voltage level shifter according to claim 12, wherein during a period when the first input signal is at the high voltage level, when the first boost voltage is greater than the third voltage, the tenth transistor remains turned off until the first boost voltage gradually decreases to be equal to the third voltage, so that the first boost voltage is maintained at the third voltage.

14. The voltage level shifter according to claim 9, wherein the plurality of boost circuit blocks comprise a second boost circuit block, and in the second boost circuit block, the boost and charging component comprising:

an eleventh transistor comprising a first terminal, a second terminal and a control terminal, wherein the first terminal of the eleventh transistor is coupled to the third voltage, the control terminal of the eleventh transistor receives a second input signal of the input signal, the second input signal is inverse phase with the first input signal; and a second capacitor comprising a first terminal and a second terminal, wherein the first terminal of the second capacitor is coupled to the second terminal of the eleventh transistor, the second terminal of the second capacitor receives the second input signal;

the transmission control component comprising a twelfth transistor comprising a first terminal, a second terminal and a control terminal, wherein the first terminal of the twelfth transistor is coupled to the second terminal of the eleventh transistor and the first terminal of the second capacitor, the second terminal of the twelfth transistor is coupled to the second boost input terminal, and output the second boost voltage;

the logic component comprising a second inverter comprising an input terminal and an output terminal, wherein the input terminal of the second inverter receives the second input signal, and the output terminal of the second inverter is coupled to the control terminal of the twelfth transistor;

the pull-down component comprising a thirteenth transistor comprising a first terminal, a second terminal and a control terminal, wherein the first terminal of the thirteenth transistor is coupled to the second terminal of the twelfth transistor, the second terminal of the thirteenth transistor is coupled to the second voltage, and the control terminal of the thirteenth transistor is coupled to the output terminal of the second inverter; and the voltage maintaining component comprising a fourteenth transistor comprising a first terminal, a second terminal and a control terminal, wherein the first terminal of the fourteenth transistor is coupled to the third voltage, the second terminal of the fourteenth transistor is coupled to the second terminal of the twelfth transistor, and the control terminal of the fourteenth transistor receives the second input signal.

15. The voltage level shifter according to claim 14, wherein the eleventh transistor is a P-type field effect transistor, the fourteenth transistor is an N-type field effect transistor, and the twelfth transistor and the thirteenth transistor are high-voltage metal oxide semiconductor field effect transistors, a backgate of the eleventh transistor is coupled to the second terminal of the eleventh transistor, and a backgate of the twelfth transistor is coupled to the first terminal of the twelfth transistor.

16. The voltage level shifter according to claim 1, further comprising:

a buffer circuit coupled to the voltage level shift circuit, operating between the first voltage and the second voltage, and configured to receive the shift voltage to provide an output signal.

17. The voltage level shifter according to claim 16, wherein the buffer circuit comprises:

a fifteenth transistor comprising a first terminal, a second terminal and a control terminal, wherein the first terminal of the fifteenth transistor is coupled to the first voltage, and the control terminal of the fifteenth transistor is coupled to the shift output terminal;

a sixteenth transistor comprising a first terminal, a second terminal and a control terminal, wherein the first terminal of the sixteenth transistor is coupled to the second terminal of the fifteenth transistor, the second terminal of the sixteenth transistor is coupled to the second voltage, and the control terminal of the sixteenth transistor is coupled to the shift output terminal;

a seventeenth transistor comprising a first terminal, a second terminal and a control terminal, wherein the first terminal of the seventeenth transistor is coupled to the first voltage, and the control terminal of the seventeenth transistor terminal is coupled to the second terminal of the fifteenth transistor and the first terminal of the sixteenth transistor; and an eighteenth transistor comprising a first terminal, a second terminal and a control terminal, wherein the first terminal of the eighteenth transistor is coupled to the second terminal of the seventeenth transistor, and outputs the output signal, the second terminal of the eighteenth transistor is coupled to the second voltage, the control terminal of the eighteenth transistor is coupled to the second terminal of the fifteenth transistor and the first terminal of the sixteenth transistor.

18. The voltage level shifter according to claim 17, wherein the fifteenth transistor, the sixteenth transistor, the seventeenth transistor and the eighteenth transistor are high-voltage metal oxide semiconductor field effect transistors.

* * * * *